(12) United States Patent
Yang

(10) Patent No.: US 7,489,511 B2
(45) Date of Patent: Feb. 10, 2009

(54) HEAT SINK CLIP

(75) Inventor: Chih-Hao Yang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/617,041

(22) Filed: Dec. 28, 2006

(65) Prior Publication Data
US 2008/0158827 A1 Jul. 3, 2008

(51) Int. Cl.
*H05K 7/20* (2006.01)
*A41F 1/00* (2006.01)
*A44B 17/00* (2006.01)

(52) U.S. Cl. .................. 361/704; 361/719; 257/718; 257/719; 24/453; 24/581.1

(58) Field of Classification Search ............... None
See application file for complete search history.

(56) References Cited

U.S. PATENT DOCUMENTS

| 5,191,513 | A | * | 3/1993 | Sugiura et al. | ............... 361/752 |
| D336,420 | S | * | 6/1993 | Fujimoto | ............... D8/354 |
| 5,384,940 | A | | 1/1995 | Soule et al. | |
| 5,730,210 | A | * | 3/1998 | Kou | ............... 165/80.3 |
| 5,870,286 | A | * | 2/1999 | Butterbaugh et al. | ............... 361/704 |
| 6,105,215 | A | * | 8/2000 | Lee | ............... 24/458 |
| 6,112,378 | A | * | 9/2000 | Lee | ............... 24/458 |
| 6,304,452 | B1 | * | 10/2001 | Lo | ............... 361/704 |
| 6,307,748 | B1 | * | 10/2001 | Lin et al. | ............... 361/704 |
| 6,331,937 | B1 | * | 12/2001 | Bartyzel | ............... 361/687 |
| 6,392,889 | B1 | * | 5/2002 | Lee et al. | ............... 361/704 |
| 6,412,546 | B1 | * | 7/2002 | Lin et al. | ............... 165/80.3 |
| 6,594,870 | B1 | * | 7/2003 | Lambrecht et al. | ............... 24/297 |
| 6,666,640 | B1 | * | 12/2003 | Hsieh | ............... 411/508 |
| 6,697,256 | B1 | * | 2/2004 | Horng et al. | ............... 361/704 |
| 6,752,577 | B2 | * | 6/2004 | Chen et al. | ............... 411/508 |
| 7,073,231 | B2 | * | 7/2006 | Draggoo et al. | ............... 24/297 |
| 7,164,583 | B2 | * | 1/2007 | Lee et al. | ............... 361/704 |
| 2007/0217159 | A1 | * | 9/2007 | Long et al. | ............... 361/704 |

FOREIGN PATENT DOCUMENTS

| CN | 99235725.X | 3/2000 |
| CN | 99235741.1 | 4/2000 |
| CN | 03272846.8 | 9/2004 |
| TW | M280099 | 11/2005 |

* cited by examiner

*Primary Examiner*—Boris L Chervinsky
(74) *Attorney, Agent, or Firm*—Frank R. Niranjan

(57) ABSTRACT

A heat sink assembly (100) which has a heat sink clip (20) is provided. The heat sink clip includes a pin (22) and a spring (24) disposed around the pin. The pin has a head (222) and a clamping portion (224) at opposite ends thereof. An abutting portion (226) in the form of an annular flange is formed between the head and the clamping portion. The spring is located between the head and the abutting portion. The pin includes an upper section (22a) and a lower section (22b) having a diameter smaller than that of the upper section. The flange extends radially outwardly from an outer surface of the lower section of the pin. The abutting portion is for engaging with a bottom surface of a heat sink (10) when the clip is mounted to the heat sink.

10 Claims, 10 Drawing Sheets

HEAT SINK CLIP

CROSS-REFERENCES TO RELATED APPLICATION

Relevant subject matter is disclosed in U.S. patent application Ser. No. 11/565,500, filed on Nov. 30, 2006 and having a same title with the present application, both of which are assigned to the same assignee as the present application. The disclosure of the application is incorporated herein by reference.

BACKGROUND OF THE INVENTION

1. Field of the Invention

The present invention relates generally to heat sink clips, and more specifically to a heat sink clip for securing a heat sink to a heat generating electronic component to remove heat from the electronic component.

2. Description of Related Art

With the continuing development of computer technology, electronic components such as central processing units (CPUs) of computers are being made to operate at higher operational speeds and to have greater functional capabilities. When a CPU operates at high speed in a computer enclosure, its temperature increases rapidly. To avoid damage to the CPU, heat generated by the CPU must be dissipated quickly, which can be done by, for example, using a heat sink attached to a surface of the CPU to absorb the heat from the CPU. The heat absorbed by the heat sink is then dissipated to ambient air.

To secure the heat sink to the heat generating electronic component, a heat sink clip is required. A currently available heat sink clip is disclosed in U.S. Pat. No. 5,384,940. The clip includes an elongated pin and a coil spring, wherein the spring is disposed around the pin. The pin passes through aligned holes defined in a heat sink and a printed circuit board thereby attaching the heat sink to an electronic component mounted on the printed circuit board.

However, before the clip and the heat sink are secured to the printed circuit board, the clip is separated from and not tied to the heat sink. In other words, the clip is not preassembled to the heat sink beforehand. Thus, it is difficult for the clip to be manipulated manually to align with the holes of the heat sink and the printed circuit board. Furthermore, having the clip and the heat sink in separate parts also increases the shipment cost when the clip and the heat sink are commercially marketed.

Therefore, it is desirable to provide a heat sink clip which can overcome the above-mentioned disadvantages.

SUMMARY OF THE INVENTION

The present invention relates to a heat sink clip. According to a preferred embodiment of the present invention, the heat sink clip includes a pin and a spring disposed around the pin. The pin has a head at one end thereof and a clamping portion at another end thereof. Moreover, the pin includes an upper section and a lower section having a diameter smaller than that of the upper section. An abutting portion extends radially outwardly from an outer surface of the lower section of the pin, and the abutting portion is in the form of an annular flange. The abutting portion engages with a bottom surface of a heat sink when the pin is inserted downwardly through a hole of the heat sink. The spring is compressed between the head of the pin and the heat sink, whereby the clip is fixedly attached to the heat sink before the heat sink is mounted to a heat generating electronic component on a circuit board.

Other advantages and novel features of the present invention can be drawn from the following detailed description of a preferred embodiment of the present invention, in which:

BRIEF DESCRIPTION OF THE DRAWINGS

Many aspects of the present heat sink clip can be better understood with reference to the following drawings. The components in the drawings are not necessarily drawn to scale, the emphasis instead being placed upon clearly illustrating the principles of the present heat sink clip. Moreover, in the drawings, like reference numerals designate corresponding parts throughout the several views.

DETAILED DESCRIPTION OF THE INVENTION

Figure 1:
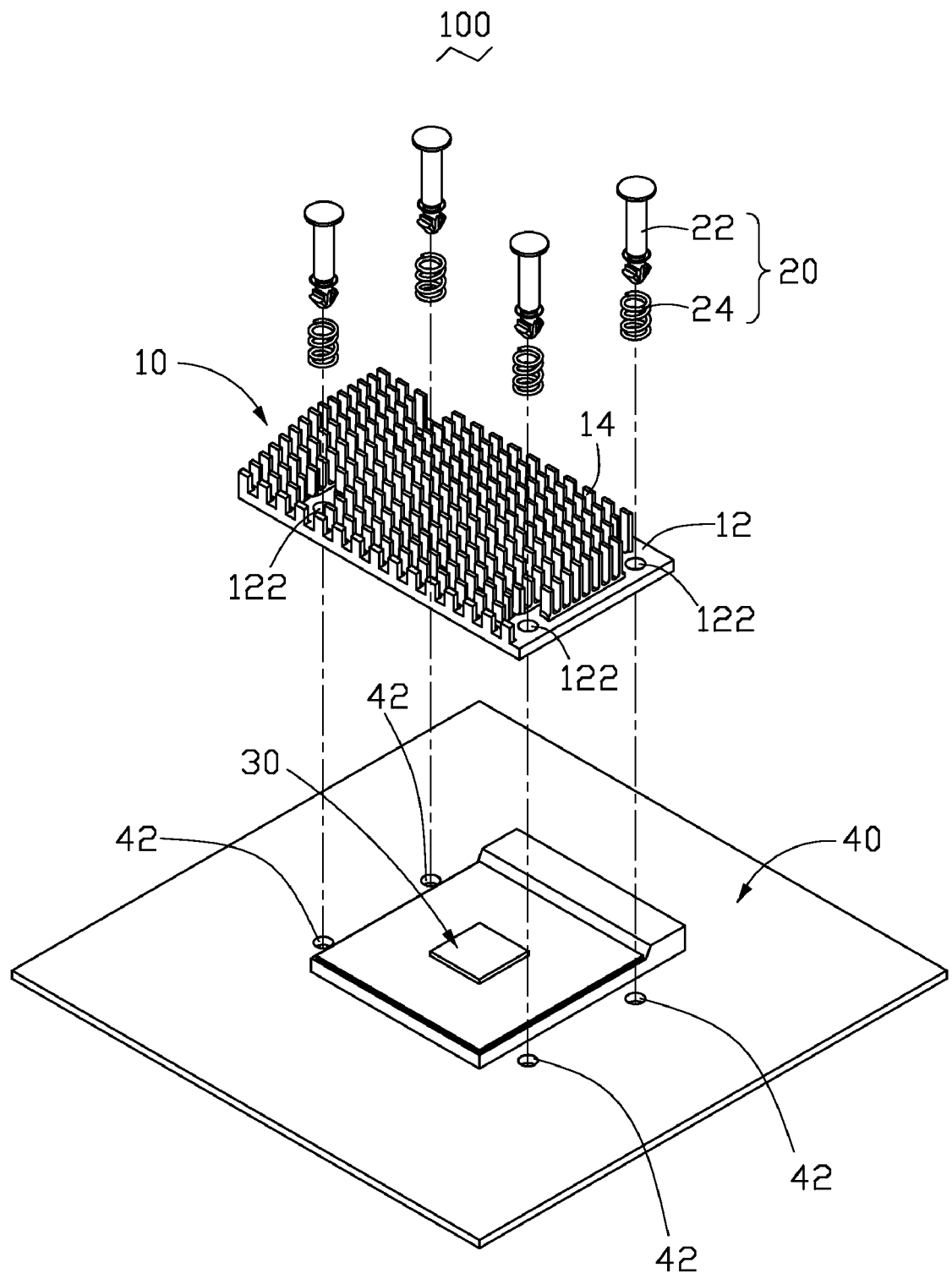
FIG. 1 is an exploded, isometric view of a heat sink assembly in accordance with a first preferred embodiment of the present invention.

Referring to FIG. 1, a heat sink assembly 100 in accordance with a preferred embodiment of the present invention includes a heat sink 10, a plurality of clips 20, a heat generating component 30 and a circuit board 40.

The heat generating component 30 is mounted on the board 40 via a socket (not labeled). The board 40 defines four holes 42 which are disposed adjacent to and surrounding the heat generating component 30. In the shown embodiment, the heat generating component 30 is a CPU.

The heat sink 10 includes a base 12 and a plurality of fins 14 integrally formed with and extending upwardly from the base 12. The base 12 has a plate-type structure, and defines four through holes 122 at four corners thereof to correspond with the holes 42 in the board 40 for extension of the clips 20.

Figure 2:
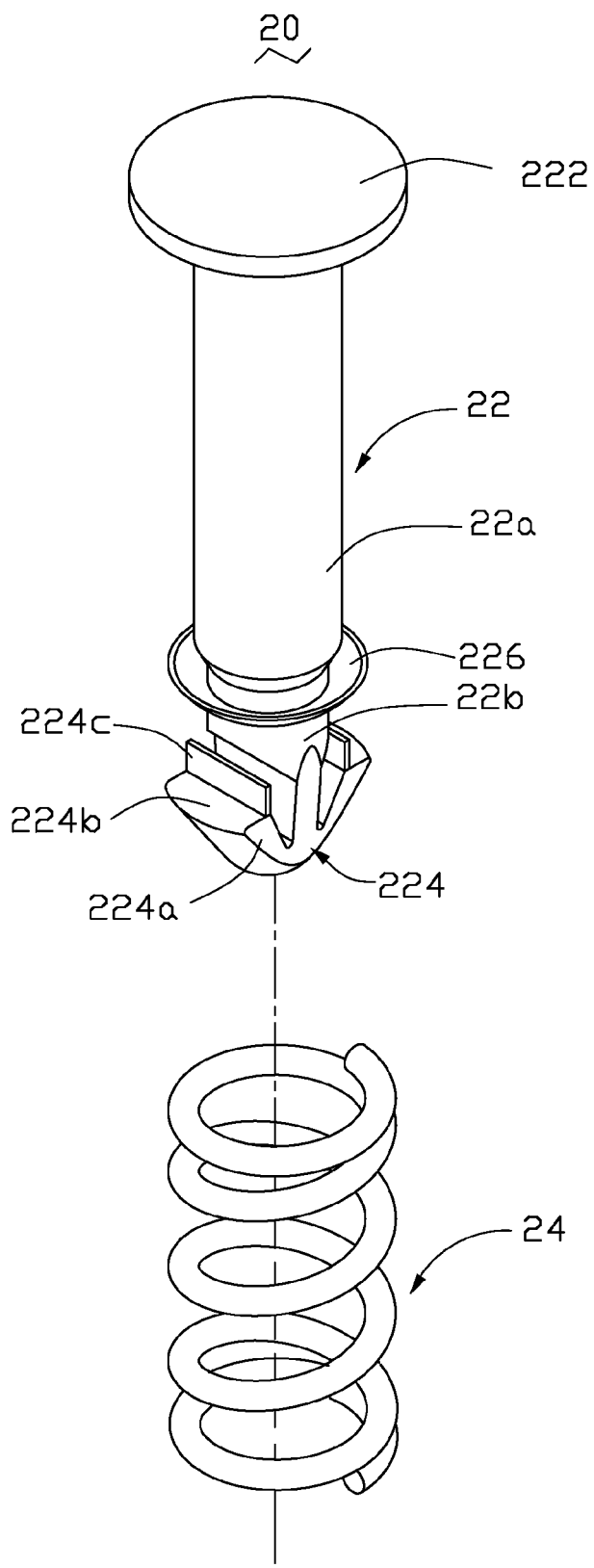
FIG. 2 is an exploded, isometric view of a clip of the heat sink assembly of FIG. 1.
Figure 3:
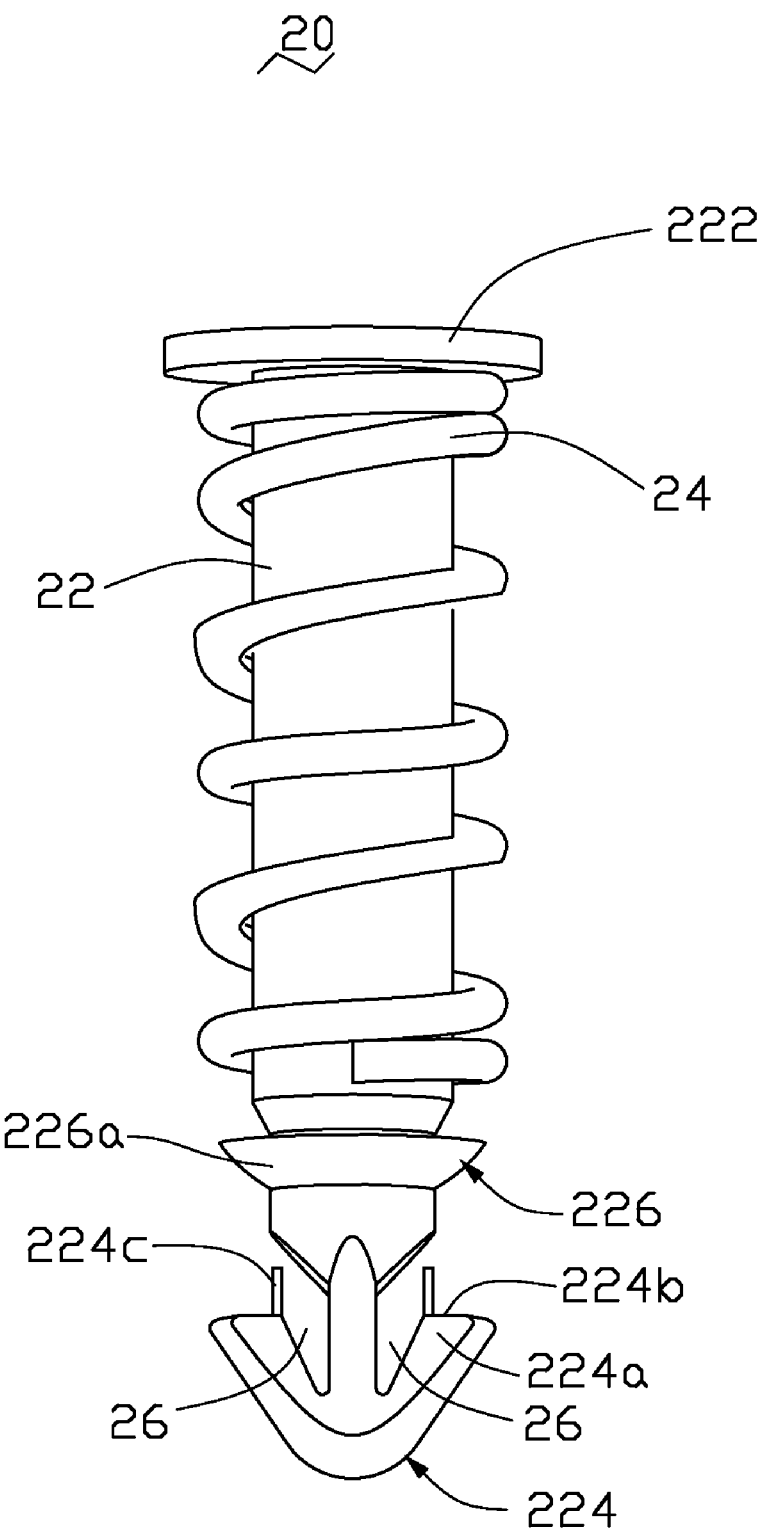
FIG. 3 is an assembled view of the fastener of FIG. 2.

Referring to FIG. 2 and FIG. 3, each clip 20 includes an elongated pin 22 and a coil spring 24. The pin 22 typically is made of plastic material, and has a columned structure. It is obvious that the pin 22 can also be made of metallic materials. The pin 22 includes an upper section 22a and a lower section 22b below the upper section 22a. A diameter of the lower section 22b is smaller than that of the upper section 22a. A top end of the upper section 22a is provided with an enlarged head 222. The spring 24 is dimensioned to loosely fit around the upper section 22a, and contacts the head 222 of the pin 22 when installed onto the pin 22.

A clamping portion 224 is formed at a bottom end of the lower section 22b. The clamping portion 224 has an anchor-shaped cross-section (referring to FIG. 3), and includes a pair of hooks 224a extending outwardly and upwardly from a bottom thereof towards two opposite lateral sides of the pin 22. A portion of the material of the bottom end of the lower section 22b of the pin 22 is cut away so that a groove 26 is formed between each hook 224a and the bottom end of the lower section 22b of the pin 22. As a result, the hooks 224a can be deformed easily when they are compressed toward each other, but when the hooks 224a are freed, they will return to their original positions. A horizontal abutting surface 224b is formed on a top end of each hook 224a, and a tab 224c extends upwardly from an inner side of each abutting surface 224b adjacent to the lower section 22b of the pin 22. A maximum outer diameter of the clamping portion 224 is greater than that of each of the holes 42 of the board 40 so that the abutting surface 224b can engage with a bottom surface of the board 40 after the clip 20 is fixed to the board 40.

An annular abutting portion 226 is formed at a top end of the lower section 22b of the pin 22, and is located between the upper section 22a and the clamping portion 224. The abutting portion 226 is in the form of an annular flange extending radially outwardly from an outer surface of the lower section 22b of the pin 22. A maximum diameter of the abutting portion 226 is greater than that of the holes 122 of the heat sink 10 so that the abutting portion 226 can engage with a bottom surface of the heat sink 10 after the clip 20 is attached to the heat sink 10. The abutting portion 226 has an elastic nature, and flares towards the head 222 as it extends radially outwardly from the pin 22 so that an arc-shaped outer surface 226a (as shown in FIG. 3) is provided at a lower side of the abutting portion 226 in order to facilitate insertion of the pins 22 into the holes 122 of the heat sink 10. The arc-shaped outer surface 226a faces downwardly. As a result, the abutting portion 226 is endowed with sufficient flexibility and therefore can be deformed easily when it is compressedly extended through the hole 122 of the heat sink 10. After the clamping portion 224 extends through the hole 122, the compressed status is released, and the abutting portion 226 will return to its original position.

Figure 4:
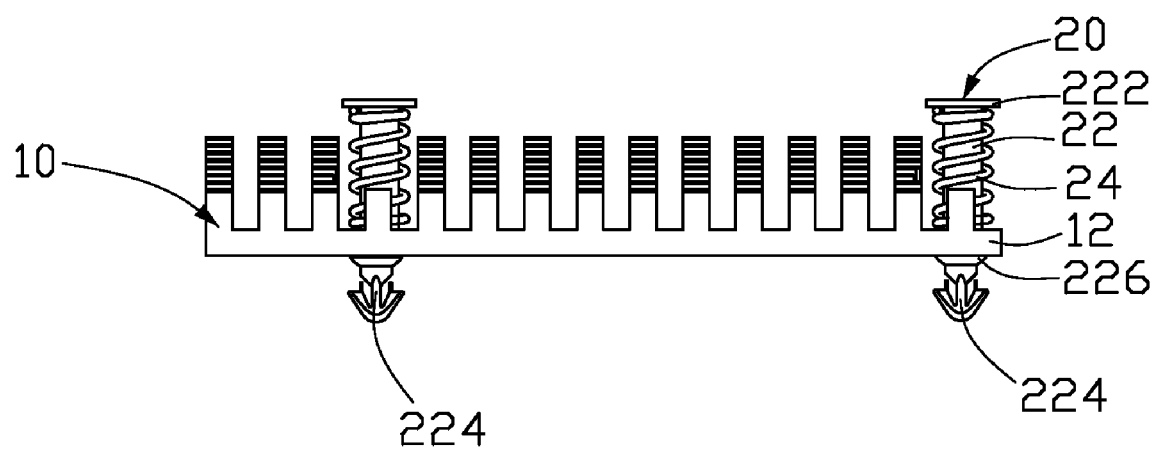
FIG. 4 is an assembled, side view of the heat sink assembly of FIG. 1 before it is secured to a circuit board thereof.

Referring to FIG. 1 to FIG. 4, in order to install the clip 20 onto the heat sink 10, the spring 24 is firstly disposed around the pin 22, and located between the head 222 and the abutting portion 226. The head 222 of the clip 20 is pushed so that the clamping portion 224 and the abutting portion 226 are sequentially inserted into and pass through the hole 122 of the heat sink 10. When the abutting portion 226 has passed through the hole 122, the abutting portion 226 returns to its original position, and contacts with the bottom surface of the base 12 of the heat sink 10. At this time, the spring 24 is slightly compressed between the head 222 and a top surface of the base 12 of the heat sink 10, to thereby secure the clip 20 to the heat sink 10 beforehand (as shown in FIG. 4). It is recognized, however, that the spring 24 can also be substituted by other suitable biasing means such as elastic tab or elastic plate such as a V-shaped plate.

Figure 5:
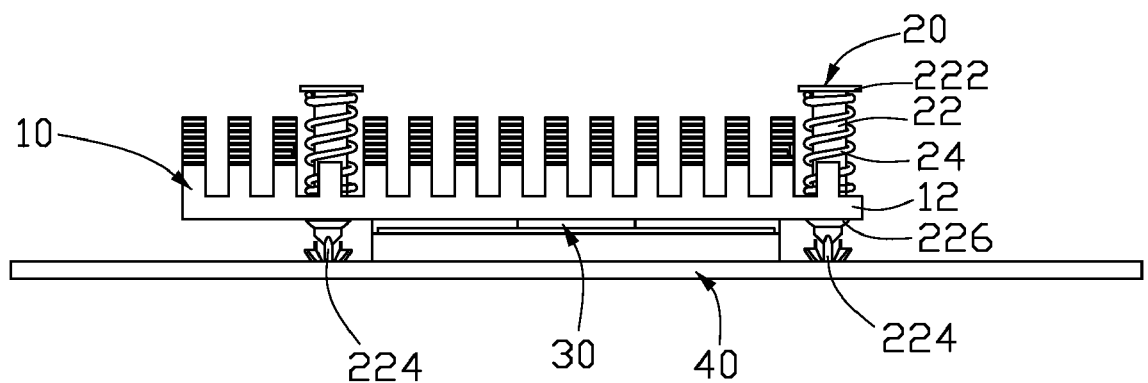
FIG. 5 is similar to FIG. 4, but showing the heat sink assembly is ready to be secured to the circuit board.
Figure 6:
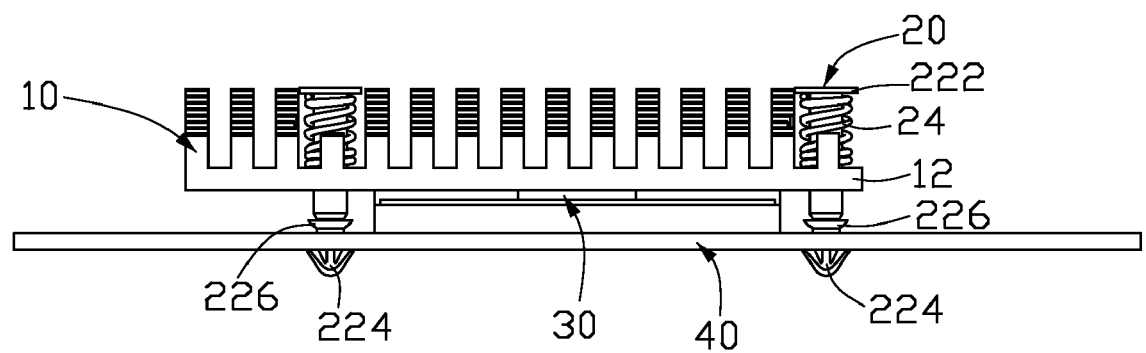
FIG. 6 is similar to FIG. 5, but showing the heat sink assembly secured to the circuit board.
Figure 7:
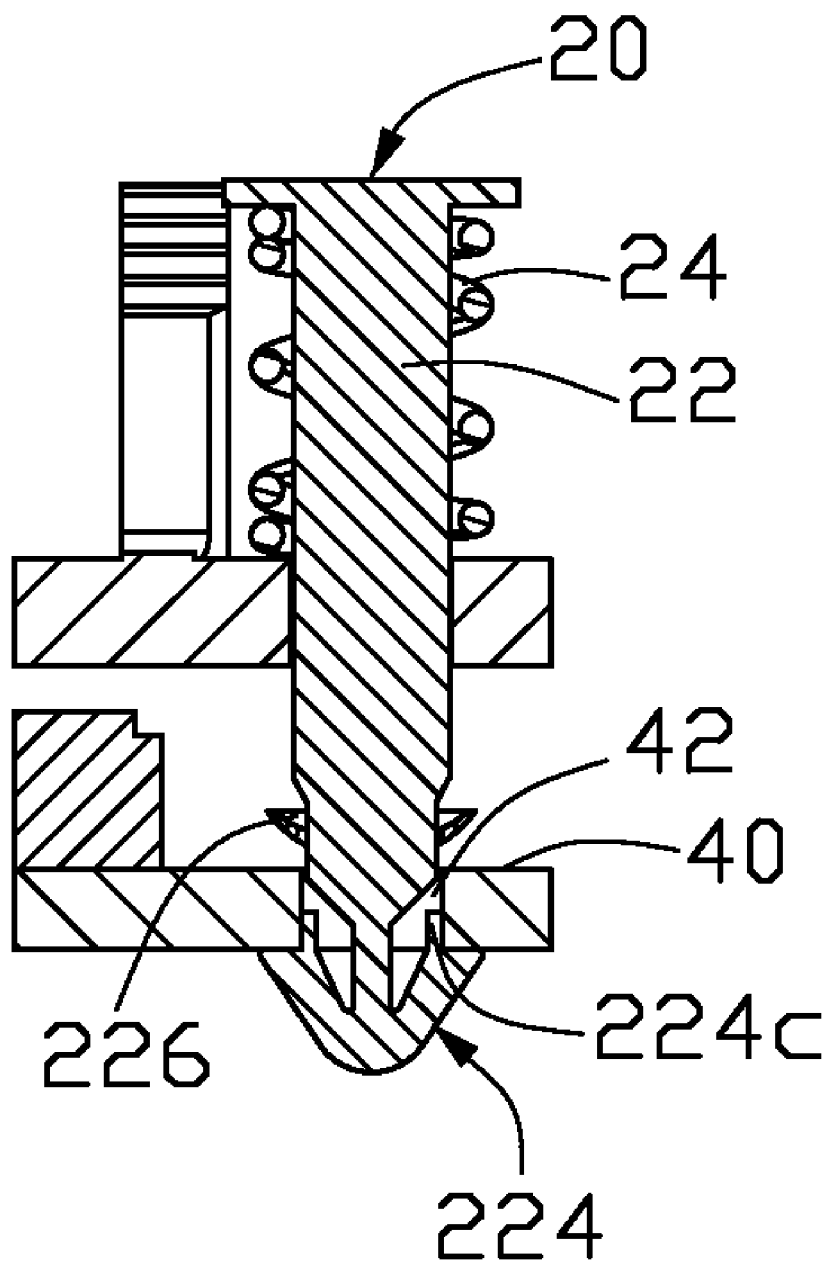
FIG. 7 is a cross-sectional view of a portion of FIG. 6.
Figure 8:
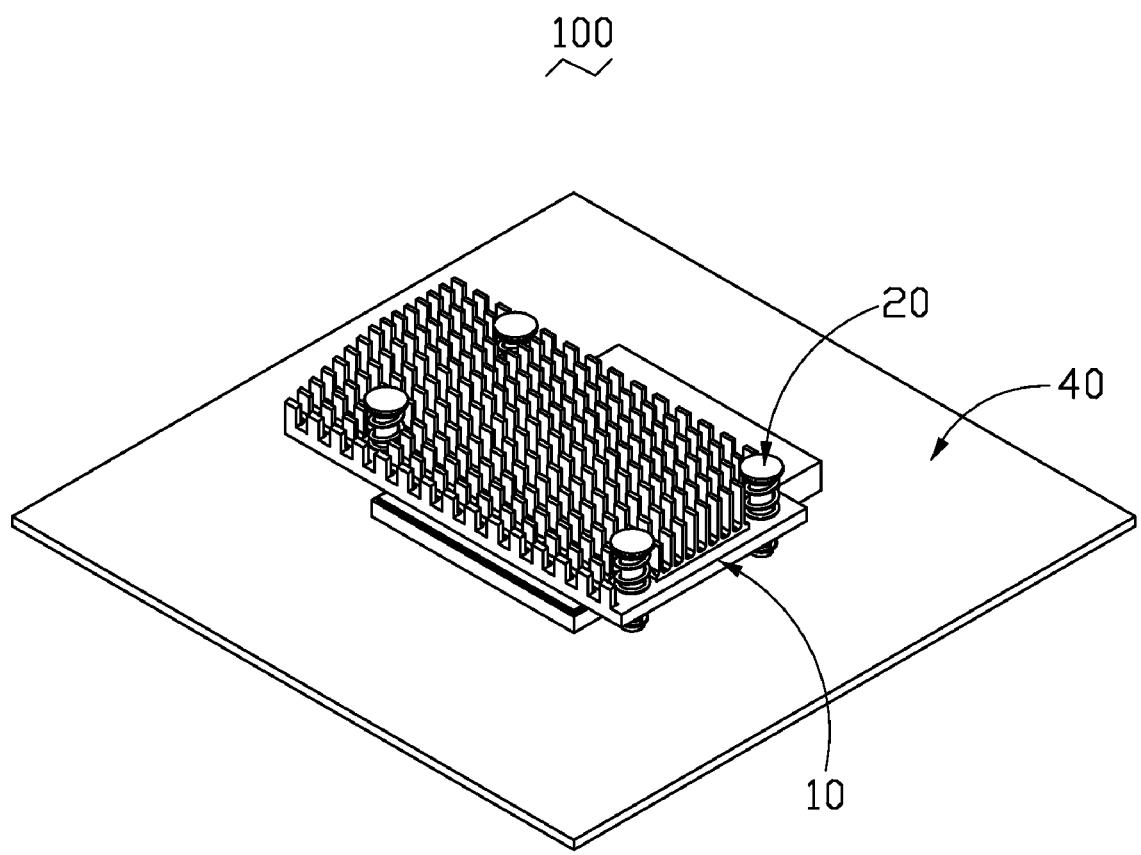
FIG. 8 is an assembled, isometric view of the heat sink assembly of FIG. 1.

To install the heat sink 10 with the clip 20 to the board 40, the base 12 of the heat sink 10 is placed on the heat generating component 30. The clips 20 are aligned with the holes 42 of the board 40, and a bottom portion of the clamping portion 224 of each clip 20 is partially received in a corresponding hole 42 of the board 40, as shown in FIG. 5. Referring to FIG. 6 to FIG. 8, the head 222 of the clip 20 is further pushed downwardly to cause the clamping portion 224 to insert into and pass through the corresponding hole 42 of the board 40. When the clamping portion 224 of the pin 22 has passed through the hole 42, the clamping portion 224 returns to its original position, the tabs 224c of the clamping portion 224 abut against inner surface of the corresponding hole 42 to stabilize the clip 20, and the abutting surfaces 224b of the clamping portion 224 engage with the bottom surface of the board 40 to prevent withdrawal of the clip 20, thereby attaching the heat sink 10 to the heat generating component 30 steadily, as shown in FIG. 7. At this time, the abutting portion 226 stands freely.

From the above description of the embodiment of the present invention, the clips 20 can be preassembled to the heat sink 10 before the heat sink 10 is finally mounted to the heat generating component 30.

Figure 9:
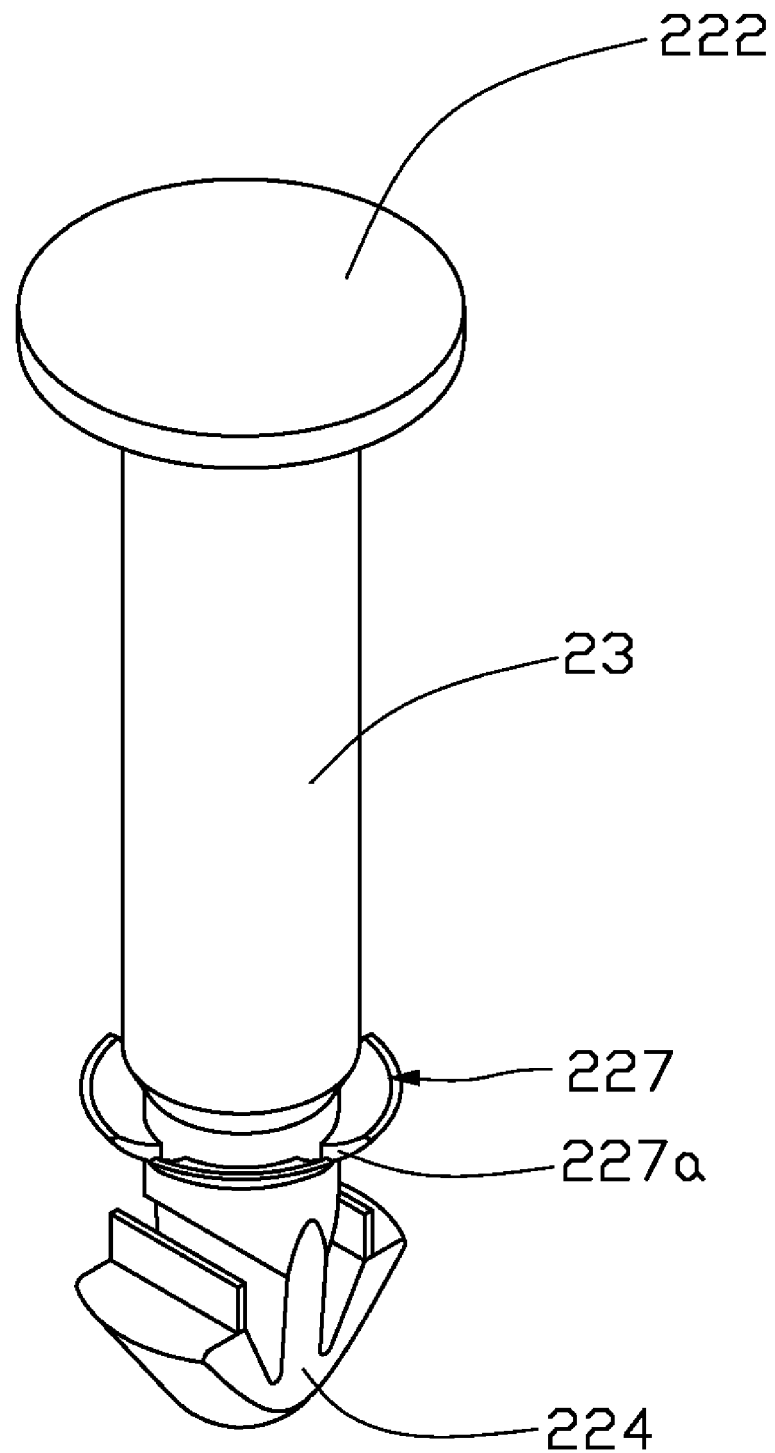
FIG. 9 is a pin of the heat sink clip in accordance with a second preferred embodiment of the present invention.

FIG. 9 shows a pin 23 of the clip in accordance with a second preferred embodiment of the present invention. To enhance the flexibility of the abutting portion 226 of the pin 22 shown in the first embodiment, the abutting portion 227 of the pin 23 in this embodiment defines a plurality of radial slots 227a therethrough, and the slots 227a are equidistantly spaced from each other. As a result, the abutting portion 227 is divided into a plurality of individual parts by the slots 227a. Therefore, the abutting portion 227 of the pin 23 can be deformed more easily as compared to the abutting portion 226 of the pin 22 of the first embodiment. Other structures of the pin 23 of the second preferred embodiment are the same as those of the pin 22 of the first preferred embodiment.

Figure 10:
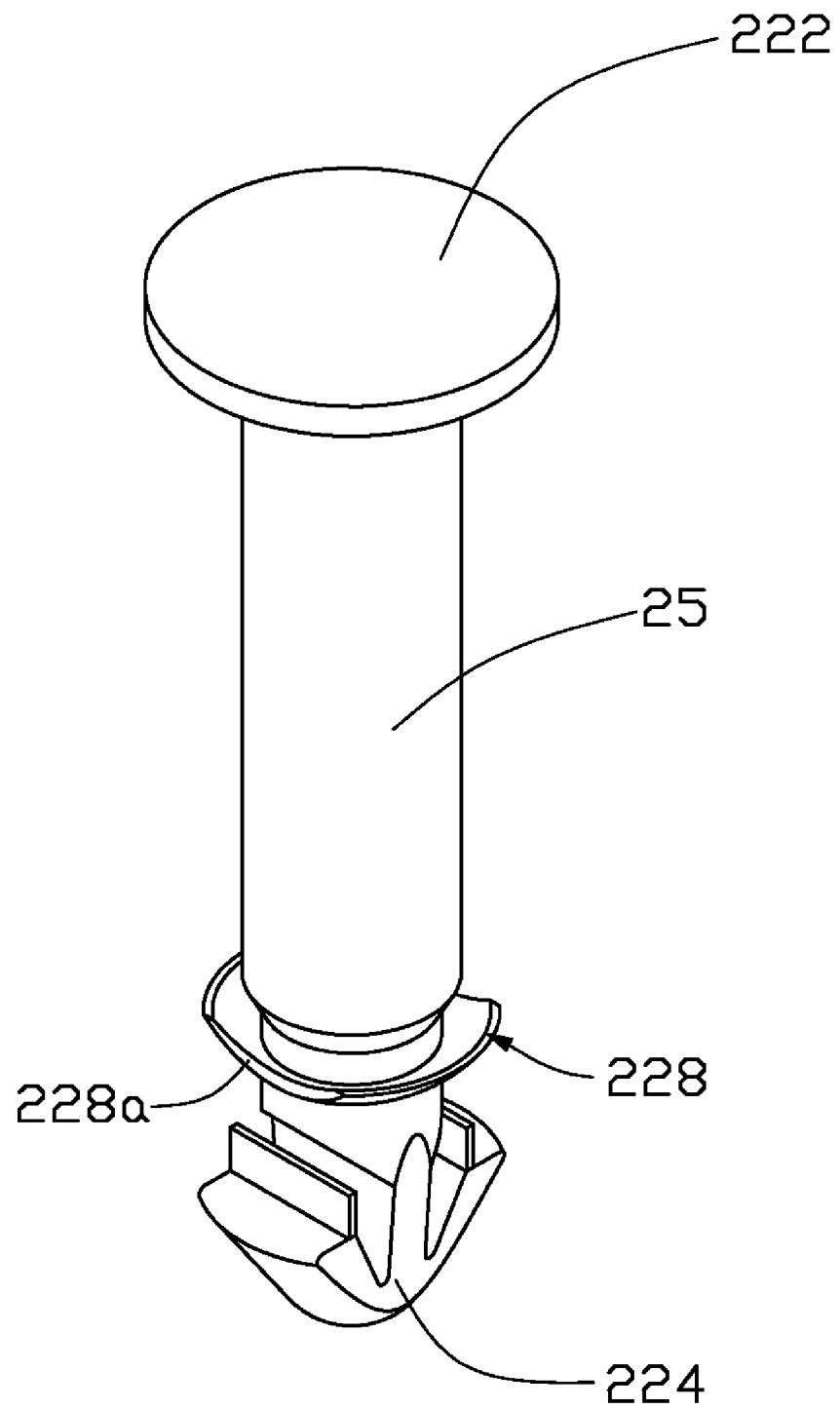
FIG. 10 is a pin of the heat sink clip in accordance with a third preferred embodiment of the present invention.

FIG. 10 shows a pin 25 of the clip in accordance with a third embodiment of the present invention, in which a portion of the material of the annular abutting portion 228 is removed away from two opposite sides thereof so that two cutouts 228a are defined thereat. This also can increase the elasticity of the annular abutting portion 228.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink clip comprising:
   a pin having a head at one end thereof and a clamping portion at another end thereof, the pin including an upper section and a lower section having a diameter smaller than that of the upper section; and
   a spring disposed around said pin and between the head and the clamping portion of the pin, wherein
   an abutting portion extends radially outwardly from an outer surface of the lower section of the pin, and the abutting portion is in the form of an annular flange, the abutting portion being adapted for engaging with a bottom surface of a heat sink when the pin is mounted to the heat sink with the spring being compressed between the head and the heat sink;
   wherein said clamping portion has an anchor-shaped cross-section, and comprises a pair of hooks located at two opposite sides of the pin, a groove being formed between each hook and the lower section of the pin; and
   wherein an abutting surface is formed on a top end of each hook, and a tab extends upwardly from a lateral side of the abutting surface, the abutting surface being adapted for engaging with a bottom surface of a circuit board when the clip is inserted through a hole of the circuit board and the tab being adapted for engaging with an inner surface of the hole when the abutting surface engages with the bottom surface of the circuit board.

2. The heat sink clip as described in claim 1, wherein said pin is made of plastic material.

3. The heat sink clip as described in claim 1, wherein said abutting portion defines a plurality of radial slots therethrough.

4. The heat sink clip as described in claim 3, wherein the slots are equidistantly spaced from each other.

5. The heat sink clip as described in claim 1, wherein said abutting portion defines two cutouts at two opposite sides thereof.

6. The heat sink clip as described in claim 1, wherein the abutting portion has an elastic nature.

7. A heat sink assembly comprising:

a heat sink defining at least one hole therein; and at least one clip comprising a pin and a biasing means disposed around the pin, the pin having a head at one end thereof and a clamping portion at another end thereof adapted for engaging with a circuit board, the pin including an upper section and a lower section having a diameter smaller than that of the upper section, an abutting portion being in the form of an annular flange disposed at the lower section, the abutting portion of said pin being capable of deformably passing through the at least one hole of said heat sink and abutting against a bottom surface of the heat sink when the abutting portion has passed through the at least one hole of said heat sink, wherein the biasing means is compressed between the head of said pin and the heat sink;

wherein said clamping portion comprises a pair of hooks at two opposite sides of the pin, and wherein a groove is formed between each hook and the pin; and wherein an abutting surface is formed on a top end of each hook, and a tab extends upwardly from a lateral side of the abutting surface, the abutting surface being adapted for engaging with a bottom surface of the circuit board when the clamping portion extends through the circuit board, and the tab being adapted for engaging in the circuit board when the abutting surface engages with the bottom surface of the circuit board.

8. The heat sink assembly as described in claim 7, wherein said abutting portion defines a plurality of slots therethrough.

9. The heat sink assembly as described in claim 8, wherein the slots are equidistantly spaced from each other along a circumferential direction of the pin.

10. The heat sink assembly as described in claim 7, wherein said abutting portion defines two cutouts at two opposite sides thereof.

* * * * *